(12) United States Patent
McGraw et al.

(10) Patent No.: US 9,178,184 B2
(45) Date of Patent: Nov. 3, 2015

(54) DEPOSITION OF PATTERNED ORGANIC THIN FILMS

(71) Applicant: UNIVERSAL DISPLAY CORPORATION, Ewing, NJ (US)

(72) Inventors: Gregory McGraw, Yardley, PA (US); Paul E. Burrows, Chattaroy, WA (US); Siddharth Harikrishna Mohan, Plainsboro, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 55 days.

(21) Appl. No.: 13/896,744

(22) Filed: May 17, 2013

(65) Prior Publication Data
US 2014/0235012 A1    Aug. 21, 2014

Related U.S. Application Data

(60) Provisional application No. 61/767,467, filed on Feb. 21, 2013.

(51) Int. Cl.
| | | |
|---|---|---|
| *B05C 5/00* | (2006.01) | |
| *B05B 7/06* | (2006.01) | |
| *H01L 51/56* | (2006.01) | |
| *C23C 14/12* | (2006.01) | |
| *C23C 14/22* | (2006.01) | |
| *H01L 51/00* | (2006.01) | |

(52) U.S. Cl.
CPC ............ *H01L 51/56* (2013.01); *C23C 14/12* (2013.01); *C23C 14/22* (2013.01); *C23C 14/228* (2013.01); *H01L 51/0004* (2013.01); *Y02E 10/549* (2013.01)

(58) Field of Classification Search
CPC .............................. H01L 51/56; H05K 3/125
USPC ................ 118/300, 313–315, 321, 323, 326, 118/410–412; 422/63, 65; 436/180, 174, 436/43, 49; 73/864.01, 864.02, 864.14; 401/137–138, 145, 253; 29/558
See application file for complete search history.

(56) References Cited

U.S. PATENT DOCUMENTS

| | | | |
|---|---|---|---|
| 4,769,292 | A | 9/1988 | Tang et al. |
| 5,247,190 | A | 9/1993 | Friend et al. |
| 5,703,436 | A | 12/1997 | Forrest et al. |

(Continued)

FOREIGN PATENT DOCUMENTS

| | | |
|---|---|---|
| WO | 2008057394 | 5/2008 |
| WO | 2010011390 | 1/2010 |

OTHER PUBLICATIONS

Baldo et al.,"Highly efficient phosphorescent emission from organic electroluminescent devices", Nature, vol. 395, pp. 151-154, 1998.

(Continued)

*Primary Examiner* — Yewebdar Tadesse
(74) *Attorney, Agent, or Firm* — Morris & Kamlay LLP

(57) ABSTRACT

Embodiments disclosed herein provide devices having a nozzle die with one or more nozzles, each of which has one or more integrated skimmers. The use of an integrated nozzle/skimmer structure allows for higher-resolution printing in OVJP-type deposition techniques without requiring the use of a shadow mask by allowing for a relatively narrow organic material beam that can be placed at relatively high distances away from the substrate.

34 Claims, 11 Drawing Sheets

(56) References Cited

U.S. PATENT DOCUMENTS

| | | | |
|---|---|---|---|
| 5,707,745 | A | 1/1998 | Forrest et al. |
| 5,793,039 | A | 8/1998 | Iino et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,703,610 | B2 | 3/2004 | Mordehai |
| 7,279,704 | B2 | 10/2007 | Walters et al. |
| 7,404,862 | B2 | 7/2008 | Shtein et al. |
| 7,431,968 | B1 | 10/2008 | Shtein et al. |
| 7,485,345 | B2 | 2/2009 | Renn et al. |
| 7,690,325 | B2 * | 4/2010 | Henderson et al. ........... 118/300 |
| 7,744,957 | B2 | 6/2010 | Shtein et al. |
| 7,879,401 | B2 | 2/2011 | Forrest et al. |
| 7,897,210 | B2 | 3/2011 | Shtein et al. |
| 7,938,079 | B2 | 5/2011 | King et al. |
| 7,968,146 | B2 | 6/2011 | Wagner et al. |
| 7,987,813 | B2 | 8/2011 | Renn et al. |
| 8,132,744 | B2 | 3/2012 | King et al. |
| 8,272,579 | B2 | 9/2012 | King et al. |
| 8,293,329 | B2 | 10/2012 | Forrest |
| 2003/0230980 | A1 | 12/2003 | Forrest et al. |
| 2004/0174116 | A1 | 9/2004 | Lu et al. |
| 2008/0286751 | A1 * | 11/2008 | Renaud et al. ................... 435/5 |
| 2009/0090298 | A1 | 4/2009 | King et al. |
| 2009/0252874 | A1 | 10/2009 | Essien et al. |
| 2010/0119711 | A1 * | 5/2010 | Cady et al. .................... 427/256 |

OTHER PUBLICATIONS

Baldo et al.,"Very high-efficiency green organic light-emitting devices based on electrophosphorescence", Applied Physics Letter, vol. 75, No. 1, pp. 4-6, 1999.

Beam Dynamics Inc.,"Molecular Beam Skimmers", available at http://www.beamdynamicsinc.com/skimmer_specs.htm, visited Mar. 1, 2013.

Beijerinck et al.,"Campargue-Type Supersonic Beam Sources: Absolute Intensities, Skimmer Transmission and Scaling Laws for Monoatomic Gases He, Ne, and Ar", Chem. Phys., 96, 1985.

Bird, G.,"Transition regime behavior of supersonic beam skimmer", Phys. Fluids, 19, 1976.

Campargue,"Progress in Overexpanded Supersonic Jets and Skimmed Molecular Beams in Free-Jet Zones of Silence", J. Phys. Chem. 88, 1984.

Jugroot et al.,"Numerical Investiation of Interface Region Flows in Mass Spectrometers: Neutral Gas Transport", J. Phys. D: Appl. Phys, 37, 2004.

Kantrowitz et al.,"A High Intensity Source for the Molecular Beam. 1. Theoretical", Rev. Sci. Inst., 22, 5, 1951.

Liu et al.,"Generating Particle Beams of Controlled Dimensions and Divergence: I. Theory of Particle Motion in Aerodynamic Lenses and Nozzle Expansions", Aerosol Sci. Tech., 1995.

Rader, D.J.,"Momentum Slip Correction Factor for Small Particles in 9 Common Gases", J. Aerosol Sci., 21, 1990.

TSI Inc.,"How a virtual impactor works", Application Note ITI-051 Rev. B, available at http://www.tsi.com/uploadedFiles/_Site_Root/Products/Literature/Application_Notes/ITI-051.pdf, 2013.

* cited by examiner

DEPOSITION OF PATTERNED ORGANIC THIN FILMS

PRIORITY

This application claims priority to U.S. Provisional Application No. 61/767,467, filed Feb. 21, 2013, the disclosure of which is incorporated by reference in its entirety.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic devices and, more specifically, to techniques and systems for depositing patterned organic thin films, such as for use in OLEDs and similar devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

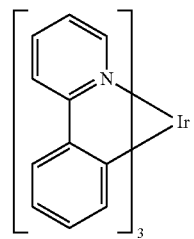

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

Embodiments of the invention provide devices and techniques that use one or more closely-spaced micronozzles, each of which is coupled to at least one skimmer, to deposit materials on a substrate. The use of an integrated nozzle/skimmer structure as disclosed herein may allow, for example, for higher-resolution printing in OVJP-type deposition techniques without requiring the use of a shadow mask. Embodiments disclosed herein may provide a relatively narrow organic material beam that can be deposited from relatively high distances above a substrate.

In an embodiment of the invention, a device is provided that includes at least one inlet via, a plurality of nozzles, each of which is in fluid communication with at least one inlet via and each of which has an aperture width a, a first plurality of skimmers, each of which may be aligned with an associated nozzle of the plurality of nozzles and having an orifice width s and an output width w, where the orifice is disposed a distance D from an outer edge of the associated nozzle, and a plurality of exhaust cavities, each of which is in fluid communication with at least one of the nozzles. Each cavity may be disposed between one of the plurality of nozzles and one of the plurality of skimmers. One or more exhaust vias and/or vacuum sources may be in fluid communication with the exhaust cavity. Similarly, one or more inlet carrier gas sources may be present and in fluid communication with the inlet via. The inlet carrier gas source may provide an inlet pressure in the range, for example, of 8-64 kPa. The device also may include a substrate support disposed a distance $d_g$ below the skimmer output. One or both of the nozzle aperture and the skimmer orifice may be rectangular, and the two may have substantially the same shape and size; alternatively, each may have a different shape and/or size.

The nozzles and skimmers may be monolithically integrated within a nozzle die, which may be formed from two portions that are welded together to form the nozzle die. The nozzle die may be a replaceable portion of the device. For example, the device may include a housing configured to receive the die and/or multiple different dies. The housing also may include a substrate holder disposed below the skimmers when the first die is disposed within the housing. The housing also may be configured to receive one or more organic material sources.

In an embodiment, a device as disclosed herein may include a second plurality of skimmers, each of which is disposed below one of the first plurality of skimmers and aligned with the one of the first plurality of skimmers and/or the nozzle associated with the first skimmers.

Various dimensions may be used for the embodiments disclosed herein. For example, a may be in the range of 5-50 μm, D in the range of 100-800 μm, s in the range of 5-100 μm, $d_g$ in the range 10-1500 μm, the skimmer sweep angle θ in the range of 0-60° or 30-50°, or any combination thereof. In some configurations, the skimmer may have a non-uniform sweep angle. For example, the skimmer may have a sweep angle that varies from a first angle, such as an angle in the range 0-50°, at a portion near the output of the skimmer, to a second angle, such as an angle in the range 70-90°, at a portion near the nozzle. The skimmer may vary continuously, or it may have multiple segments, each of which has a different sweep angle. The skimmer also may be a stepped skimmer.

Devices disclosed herein may be fabricated from various materials, including metals and/or semiconductors. In configurations having multiple nozzles and skimmers, each nozzle, skimmer, or nozzle/skimmer pair may be fabricated separately, and subsequently integrated into the device in a desired output pattern.

A rastering mechanism may be included or may operate in conjunction with the device. The rastering mechanism may move the device in a direction approximately parallel to a substrate holder placed below the skimmers. It also may move the device at a constant height from a substrate placed on the holder, and/or in a direction parallel to a longest direction of a nozzle aperture, for example when the nozzle has a rectangular output.

In an embodiment of the invention, a method of depositing a material may include providing a first carrier gas and a first organic material to a first nozzle die. The first nozzle die may include at least one inlet via; a plurality of nozzles, each of which has an aperture width a and is in fluid communication with at least one inlet via; a plurality of skimmers, each of which is aligned with an associated nozzle and has an orifice width s and an output width w, where the orifice is disposed a distance D from an outer edge of the associated nozzle; and a plurality of exhaust cavities, each of which is in fluid communication with at least one of the nozzles. Each exhaust cavity may be disposed between one of the plurality of nozzles and one of the plurality of skimmers. The method further may include ejecting the first carrier gas and the first organic material from the first nozzle die toward a substrate disposed below at least one of the skimmers. A substrate may be provided at a distance g from the output of the skimmer, where the distance g may be selected based upon the size of the smallest feature to be deposited by the first nozzle die. In an embodiment, g may be larger than the smallest dimension of a feature to be deposited. Various dimensions may be used as previously described with respect to the nozzle block and associated devices. The carrier gas and/or the organic material may be provided to each of a plurality of nozzle dies, where each nozzle die includes at least one inlet via; a plurality of nozzles, each of which is in fluid communication with at least one inlet via and has an aperture width a; a first plurality of skimmers, each of which is aligned with an associated nozzle and has an orifice width s and an output width w, where the orifice disposed a distance D from an outer edge of the associated nozzle; and a plurality of exhaust cavities, each of which is in fluid communication with at least one of the nozzles, where each exhaust cavity is disposed between one of the plurality of nozzles and one of the plurality of skimmers.

In an embodiment, a method of fabricating a deposition device may include obtaining a block of nozzle die material, etching at least one inlet via into the block, and etching a plurality of nozzles into the block, each of which is in fluid communication with at least one inlet via and has an aperture width a. A first plurality of skimmers also may be etched into the block, each of which aligns with an associated nozzle and has an orifice width s and an output width w, where the orifice is disposed a distance D from an outer edge of the associated nozzle. A plurality of exhaust cavities also may be etched, each of which is in fluid communication with at least one of the nozzles and is disposed between one of the nozzles and one of the skimmers. Various dimensions may be used as described herein with respect to the nozzle block and associated devices.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
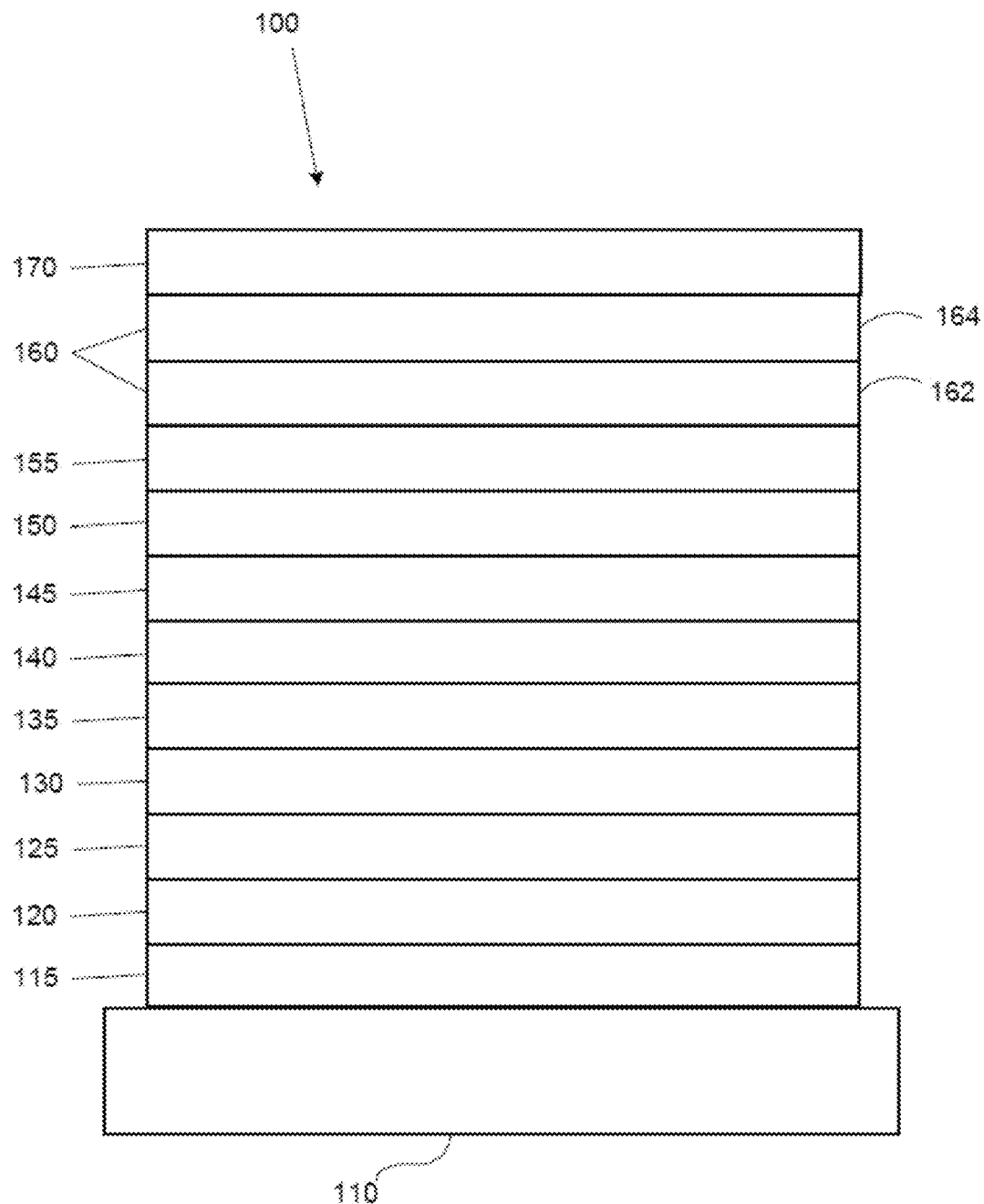
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
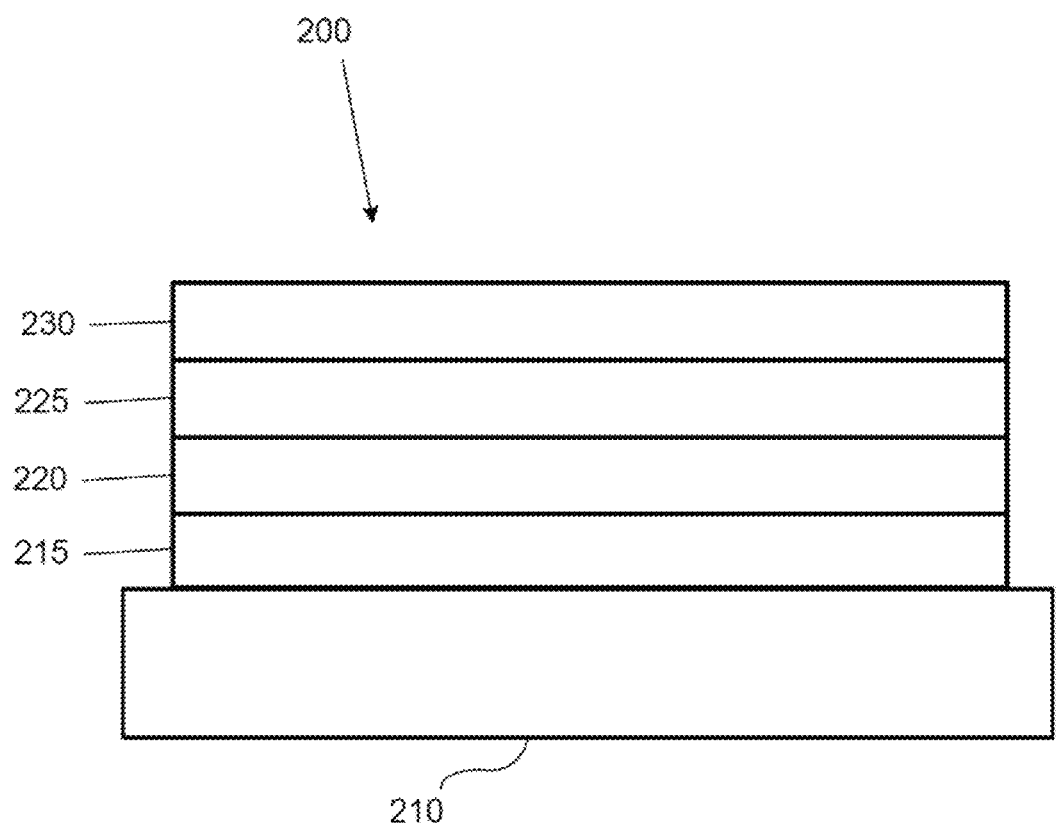
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to crystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, aralkyl, heterocyclic group, aryl, aromatic group, and heteroaryl are known to the art, and are defined in U.S. Pat. No. 7,279,704 at cols. 31-32, which are incorporated herein by reference.

As previously described, OVJP and similar techniques often are used to deposit OLED layers, OLEDs, and other components and devices. The size and separation of features obtainable by conventional schemes for OVJP typically are proportional to the separation between the print head and substrate, because the transport of material from the nozzle to the substrate is a diffusion-dominated process. Thus, printing features with a small enough pitch to achieve an aesthetically pleasing pixel density may require the print head to be in relatively close proximity, for example about 10 μm or less. Such a small distance may be difficult to maintain over the large substrates common in OLED fabrication, as described in U.S. Pat. Nos. 8,293,329, 7,431,968, 7,744,957, 7,404,862, 7,897,210 and 7,879,401. Furthermore, a large amount of carrier gas may be required to transport the organic molecules in OVJP. This may be difficult to efficiently remove from the nozzle-substrate gap, causing an increase in pressure, higher diffusion, cross-talk between adjacent nozzles and a loss of pixel definition due to blurring of the deposited features.

U.S. Pat. No. 7,879,401 describes a nozzle array using an exhaust, which includes a pumped aperture between two cylindrical nozzles. This and similar configurations may reduce or eliminate some of these issues, but still may require a relatively small nozzle-substrate separation and may cause undesirable overspray.

Embodiments of the present invention provide a nozzle and skimmer geometry which may produce a collimated beam of concentrated organic material. This may allow the distance between the substrate and nozzle array to be increased without incurring a loss of printing resolution. It also may also reduce overspray by concentrating the organic flux relative to the carrier gas.

Embodiments of the invention may include devices that improve the resolution of patterned organic thin films that can be deposited without the use of a shadow mask. Such a device may improve the collimation of organic vapor that is entrained in a carrier gas and ejected from a nozzle to deposit onto a nearby substrate. In some embodiments, the beam of organic vapor may be less than 50 μm wide, making it suitable for the micro-printing applications. In an embodiment, a device may include multiple sequential co-axial apertures. The size and shape of these apertures may be configured to perform different functions required to generate and shape the beam of ejected material. In some cases, multiple devices can be monolithically integrated on a single die, allowing multiple features to be printed on a substrate in parallel. The improved collimation of a beam as disclosed herein may allow high resolution printing to be achieved even at relatively large working distances between the device and the substrate, such as 100 μm or more. Devices as disclosed herein may be smaller than 1 mm$^2$, and may be fabricated using photolithography and/or similar processes.

Generally, devices disclosed herein incorporate one or more nozzles and one or more skimmers to achieve the effects described above. Nozzles coupled with skimmers are used in analytical tools such as mass spectrometers, where they produce a collimated and concentrated beam of analyte into a quadrapole filter. Such skimmers typically are of macroscopic dimensions, and may be made from metal which coated with an inert material to minimize reactions with the vapor phase. Examples of such skimmer designs are described in Beam Dynamics, Inc., "Molecular Beam Skimmers," available at http://www.beamdynamicsinc.com/skimmer_specs.htm. Examples of conventional mass spectrometric applications and systems are provided in U.S. Pat. Nos. 5,793,039 and 6,703,610. For example, the figures in U.S. Pat. No. 5,793,039 illustrate the formation of a beam of particles in a mass spectrometry application. The skimmer systems presented in these systems are fundamentally different from those disclosed herein, at least because in some embodiments the substrate may be disposed close to the nozzle and skimmer. Furthermore, in some preferred embodiments, systems disclosed herein may include multiple nozzles capable of printing patterns adjacent to one another, which may be monolithically integrated into a single block of, for example, silicon or other micro-machinable material. Generally, devices disclosed herein may include several relevant features, such as the use of the skimmer architecture to "shunt" a portion of carrier gas away from the nozzle-substrate gap, which may prevent the formation of a shock front that would tend to force vapor laterally away from the nozzle, and the use of multiple and/or monolithically-integrated skimmer nozzles arranged in parallel to deposit high-resolution patterned lines of organic materials.

Another technique to increase the working distance of a deposition nozzle from the substrate may be used when printing patterned films of liquid droplets in ambient pressure. Such techniques typically use a guard flow around an aerosol stream in atmospheric pressure, as described in U.S. Pat. Nos. 7,938,079, 7,485,345, 7,987,813, 8,132,744, and 8,272,579, and U.S. Published Patent Application Nos. 2009/0252874 and 2009/0090298. These techniques may maintain high resolution printing, but the aerosol and guard flow geometry typically is not suitable for processing in vacuum and generally would not be an appropriate deposition technique for vacuum deposited, small molecule organic thin films. This may be illustrated by considering the non-dimensional Stokes number, S, which expresses the fact that particles to follow streamlines of the fluid in which they are suspended. S is physically interpreted as the ratio of the acceleration undergone by a particle following a fluid streamline over the acceleration that a fluid is capable of applying to the particle. For roughly spherical particles, it is given by $$S = \frac{m_P C_S U}{108 D_P \mu L}$$

for a particle mass $m_p$, particle diameter $D_p$, flow viscosity U, and viscosity μ, as described in P. Liu et al., "Generating Particle Beams of Controlled Dimensions and Divergence: 1. Theory of Particle Motion in Aerodynamic Lenses and Nozzle Expansions" Aerosol Science and Technology, 22:3, 293-313 The characteristic length L is taken to be the feature size, and a coefficient $C_S$ accounts for a slip boundary condition at the interface between the particle and surrounding fluid due to rarefaction. The particle Knudsen number is $Kn_p = \lambda_1/D_p$. The coefficient A weakly dependents on $Kn_P$ and varies between 1.2 and 1.6:

$$C_S = (1 + A \cdot Kn_p)$$

as described in D. J. Rader, "Momentum Slip Correction Factor for Small Particles in Nine Common Gases" J. Aerosol Sci. Vol. 21 No. 2 pp. 161-168 1990. For 1 nm particles with mass 500 g/$N_A$ in a 300 m/s He jet at 1000 Pa and printing a 10 μm wide feature, S=1. Therefore, over the length scales of interest for printing, initial particle momentum and the momentum transferred from the carrier gas to the particle are roughly equivalent. The streamlines of the carrier gas cannot intersect the substrate so they bend away from it. Their perturbed motion near the substrate will therefore noticeably disrupt the flux of organic material towards the substrate. In some cases undesirable effects on feature size can be reduced or minimized by placing the nozzle orifice near the substrate. However, this can quickly become impractical for production scale tolerances.

Conversely, for the case of aerosol printing, S>10 for a 10 μm feature. This suggests that flow perturbation near the substrate will not disrupt the flow of droplets to the substrate and disrupt the printing of patterns. Small molecules generally cannot be dispersed in solvent droplets because the solvent is generally detrimental to OLED operation. Furthermore, macromolecules and nanoparticles are often difficult to process by PVD. The guard flow technique cannot be used in this case because the particles the OVJP tool deposits must be small. A conventional carrier gas jet, therefore, is a suboptimal method of directing organic material towards a substrate. A guard flow cannot be used to direct small molecules onto a substrate, as it is in aerosol printing. Diffusion of organic vapor at low pressure is extremely rapid compared to micron scale particles. The Péclet number, the ratio of convective to diffusive transport, for the previously described organic vapor jet is Pe=0.15, implying that diffusion dominates over the length scales of printed features. Organic vapor would, therefore quickly diffuse through the guard flow, whereas diffusion is negligible in an aerosol jet.

In some cases, a virtual impactor may be used to provide a gas output and/or gas-based deposition system. An example virtual impactor is described in TSI, "How a Virtual Impactor Works," available at http://www.tsi.com/uploaded-Files/_Site_Root/Products/Literature/Application_Notes/ITI-051.pdf. In such a configuration, an aerosol passes through an accelerating nozzle and is directed toward a collection probe. At this point a major portion of the flow is diverted 90° away from the collection probe. Small particles (e.g., on a scale of microns) with low inertia follow the flow streamlines and are carried away radially with the major flow. Large particles with greater inertia deviate from the flowlines and continue moving axially in their forward path down the collection probe with the minor flow. In contrast to embodiments described herein. OVJP may use skimmers to print using organic molecules in a heated rarefied gas stream (<1 atm) as opposed to micron scale droplets in a compressed gas stream, (>1 atm). A virtual impactor relies on particles having sufficient momentum to jump streamlines of a flow driven by a relatively small pressure drop. It is a system characterized by a large Stokes number. A nozzle and skimmer uses a large pressure drop to drive the expansion of a gas. The fractionation relies on molecular motion moving light components outward from the center of the jet more rapidly than heavy components. In short, a skimmer acts as a spatial filter and produces a collimated molecular beam, whereas a virtual impactor is a fractionator with an uncollimated gas output.

Figure 3:
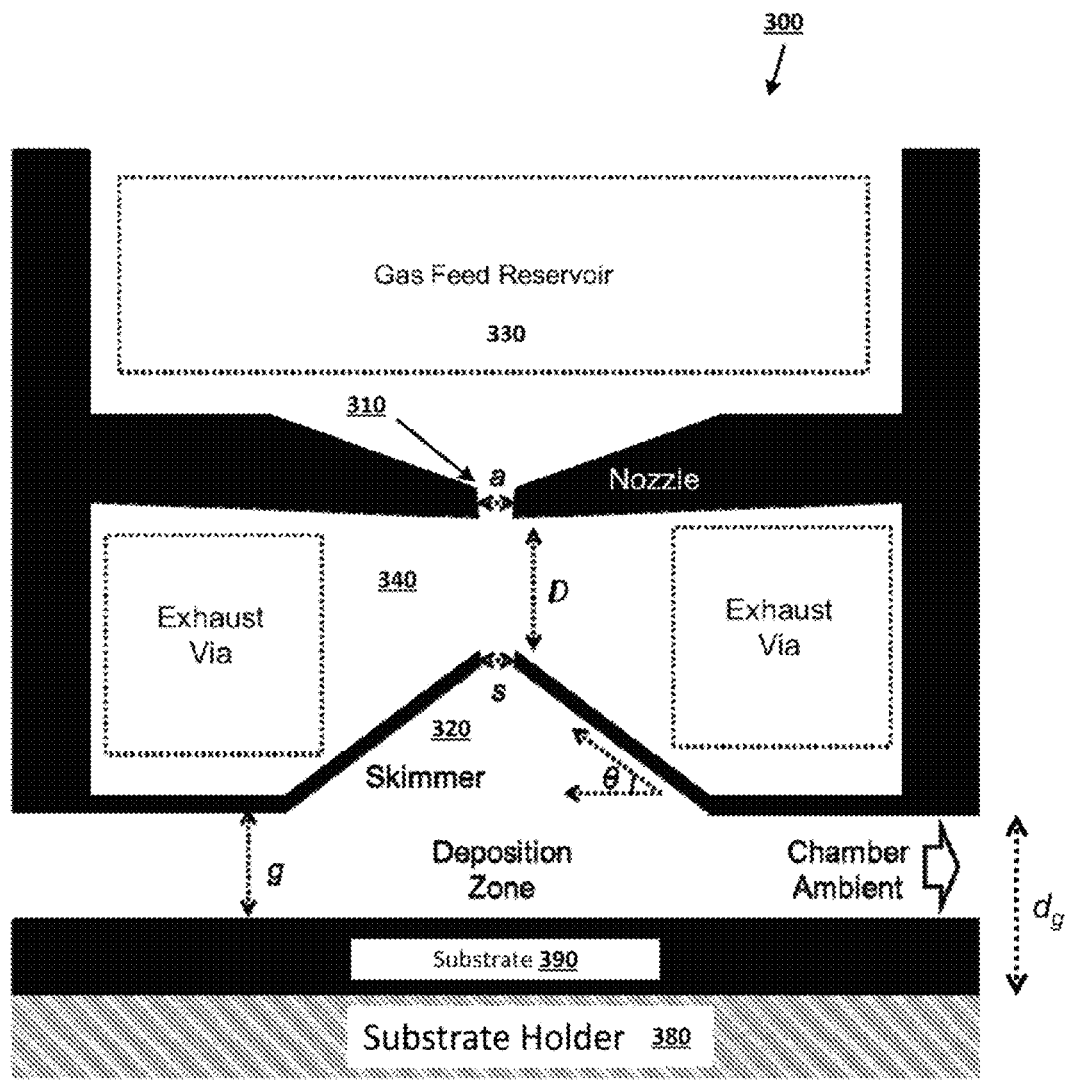
FIG. 3 shows a sectional view of a closely spaced micronozzle and skimmer on a print head die according to an embodiment of the invention.

FIG. 3 shows an example device according to an embodiment of the invention. A nozzle of width a accelerates an incoming mixture of one or more gasses. For example, a mixture of high- and low-molar gasses may be used, where the high molecular mass is one or more organic molecules, and the lower molecular mass is one or more inorganic carrier gases. A skimmer structure is located coaxially with the nozzle and includes an aperture of width s and a cone formed at an angle θ to the plane of the nozzle orifice. The skimmer may isolate the central portion of the jet, which typically is richer in organic molecules, to form a molecular beam. The edge of the jet, which typically is richer in carrier gas, is rejected and directed or transported away from the substrate.

Once a collimated beam of organic material is achieved, the molecules generally should not change trajectory until they impact the substrate and adsorb. The pressure in the region between the print head and substrate should be on the order of P=10 Pa or less for the mean free path, $\lambda_2$, of an organic molecule to reach the substrate without colliding with a stray carrier gas molecule. As described by W. G. Vincenti and C. H. Kruger Introduction to Physical Gas Dynamics Kreiger, Malabar, Fl 1975, the mean free path the minority component in a gas mixture is given by:

$$\lambda_2 = \frac{k_B T}{P\pi(d_1 + d_2)^2} \sqrt{\frac{m_1}{m_1 + m_2}}$$

where $m_1$ is the molecular mass, $d_1$ the molecular diameter of the majority component, $m_2$ and $d_2$ the molecular mass and diameter of the minority component, respectively, T is gas temperature, and $k_B$ is Boltzmann's constant. Since a guarded jet typically will not carry organic vapor directly to the substrate, OVJP may benefit from a different approach. The principles discussed for aerosol printing apply to an incompressible fluid. Particles of varying mass in a compressible fluid behave differently, particularly while the fluid is undergoing an expansion.

To address this difference, embodiments of the present invention may use an integrated nozzle and skimmer architecture. An example of a nozzle architecture according to an embodiment of the invention is illustrated in FIG. 3, which shows a sectional view of an integrated nozzle and skimmer structure 300. The structure may be formed from various materials as described in further detail herein, such as semiconductors, metals, and the like. The nozzle 310 and skimmer 320 may be monolithically integrated on a single die and, as described in further detail herein, multiple nozzle/skimmer combinations may be integrated on one or more such dies. In the example embodiment shown in FIG. 3, the nozzle and skimmer are monolithically integrated into a microfabricated die. The etched cavities have straight sidewalls and may extend, for example, approximately 400 μm into the page. Carrier gas and organic vapor may feed into the inlet cavity upstream of the 310 nozzle through the inlet via 330. Gas is then accelerated as it constricts to pass through the nozzle aperture and it further accelerates as it expands on entering the exhaust cavity 340. The skimmer isolates the collimated central portion of the jet from the nozzle and allows it to pass into a region of free molecular flow (at lower pressure) underneath the print head onto a substrate 390. The portion isolated by the skimmer is rich in organic material relative to the rest of the jet. The width of the nozzle aperture is a, the width of the skimmer orifice is s, and the separation between them is D. The sweep angle of the skimmer is θ. The distance between the underside of the print head and the substrate support 380 is $d_g$, and the distance to the substrate is g, as shown. For the example embodiments disclosed herein, a constant skimmer width of w=300 μm may be assumed unless explicitly stated otherwise.

In some embodiments, the device may include a substrate support 380 disposed a distance $d_g$ from the bottom plane of the skimmer. A substrate 390 on which material is to be deposited may be placed on the substrate support. Thus, a suitable distance g may be selected for a given substrate. In some cases, the position of the substrate support may be adjustable, such that the distance g may be adjusted based upon the specific substrate used. Similarly, for an irregular or non-planar substrate, the substrate support, the nozzle block, and/or the substrate itself may be adjusted during operation of the device to maintain a constant distance g between the nozzle block and the substrate.

In some embodiments, one or more additional skimmers may be disposed below the skimmer 320, with the skimmer orifices aligned along the axis of the nozzle aperture. The use of multiple skimmers may allow for further collimation of the beam ejected from the nozzle die, and additional enhancement of the skimmer effects disclosed herein, at the cost of additional complexity and a reduction in the efficiency of materials usage. Each skimmer may have the same orifice and/or aperture shape as the skimmer 320, or different orifice and/or aperture shapes may be used, such as to achieve specific effects in the ejected beam of materials.

Generally, various ranges for the dimensions of an integrated nozzle and skimmer configuration may be used depending upon the specific application. As described in further detail herein, the following ranges may be suitable for use with common OVJP and similar applications:

a 5-50 µm
D 100-800 µm
s 5-100 µm
θ 0-60° or, more preferably, 30-50°
$d_g$ 10-1500 µm Of course, it will be understood that similar or different dimensions may be used other than the specific examples described and shown herein without departing from the scope of the invention.

Various other geometries may be used in an integrated nozzle and skimmer arrangement as disclosed herein. For example, the nozzle aperture and skimmer orifice for a given nozzle/skimmer pair may be matched, such that the nozzle aperture has the same or approximately the same shape as the skimmer orifice. In some embodiments, the nozzle aperture is rectangular and/or the skimmer orifice may be rectangular, i.e., when viewed through the nozzle in the direction of material flow, each may have a rectangular shape.

A structure as shown in FIG. 3 may be fabricated, for example, via etching processes as described in further detail herein. Alternatively or in addition, some or all of the structures shown may be fabricated by etching or otherwise fabricating several separate components, which then may be permanently joined together to form a single die. For example, the components may be joined using a diffusion-welding process to form a nozzle die.

The nozzle architecture shown and described with respect to FIG. 3 may be repeated in a single device, using multiple nozzle and skimmer pairs. In some embodiments, a single die may contain multiple units, in some cases up to 100 or several hundred units. In some embodiments, multiple nozzle and skimmer pairs may be arranged in a regular pattern within a single die, such as a linear, rectangular, or grid pattern, to allow for large-scale deposition. The use of multiple nozzles also may allow for relatively rapid deposition of patterned films, such as for a full-color display where a repeating pattern of different color sub-pixels is to be deposited. Similarly, devices according to embodiments of the invention may include a rastering mechanism such as a belt or other conveyor system, which allows the nozzle die and the substrate or substrate holder to be moved laterally relative to one another. This may allow for additional deposition and patterning configurations, such as where parallel lines or structures are to be deposited on a single substrate. In some embodiments, such as where a rectangular nozzle aperture is used, the relative movement between the die and the substrate may be parallel to the longest dimension of the nozzle aperture and parallel to the plane of the substrate to allow for efficient deposition on the substrate.

The multiple nozzles and skimmers may be monolithically integrated within a single die, or they may be fabricated separately and arranged into a single device. Each nozzle in the die or other structure may be in fluid communication with at least one inlet via as illustrated in FIG. 3. Each nozzle may have a separate and distinct inlet via, or multiple nozzles may share one or more inlet vias. Similarly, each nozzle may be in fluid communication with one or more exhaust cavities and/or exhaust vias as shown in FIG. 3. Separate exhaust vias may be provided for each nozzle, or one or more nozzles may share one or more exhaust vias. As described in further detail herein, various etching and diffusion-welding processes may be used to fabricate a nozzle die containing a series of structures as shown in FIG. 3. Alternatively or in addition, the nozzles and skimmers may be fabricated separately and subsequently integrated into a single device to form a desired output pattern such as a grid as previously described.

In an embodiment, the nozzle die may be an interchangeable and/or replaceable component in another device, such as a printer or other deposition system. For example, a housing may be configured to receive the nozzle die. When the nozzle die is placed in the housing, the various vias within the nozzle die may be placed in fluid communication with appropriate input and/or output sources. For example, one or more inlet vias in the nozzle die may be placed into fluid communication with one or more material sources, carrier gas sources, pressure sources, or the like. Alternatively or in addition, the nozzle die may include an organic source that is then placed in fluid communication with a carrier gas source, pressure source, or the like that is provided by the housing. Such a configuration may allow a single housing to print multiple types of materials with little or no modification to the housing. Alternatively or in addition, the housing may be configured to receive an interchangeable and replaceable organic source, separately from the nozzle die. In this configuration, different organic sources and nozzle configurations may be matched within a single housing, allowing for greater versatility from a single device.

Figure 4:
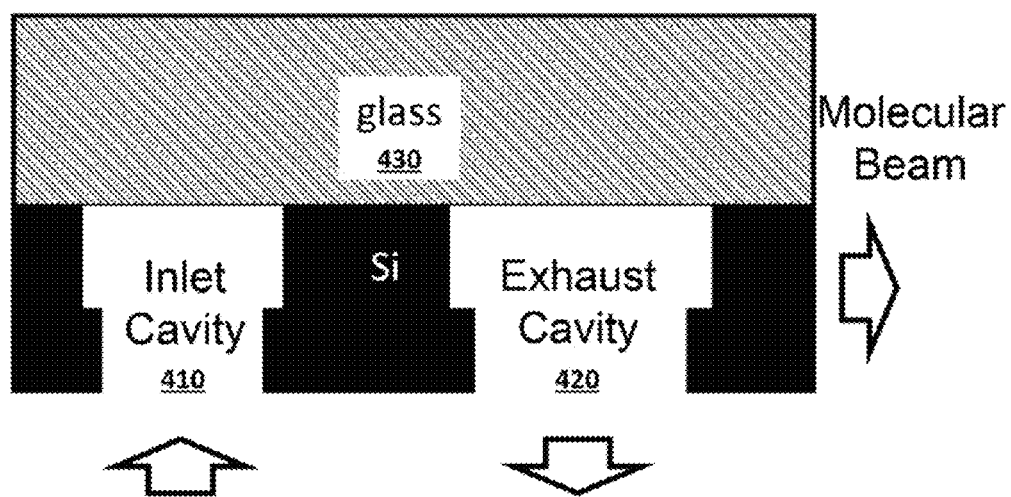
FIG. 4 shows a side view of an example print head die according to an embodiment of the invention.
Figure 5:
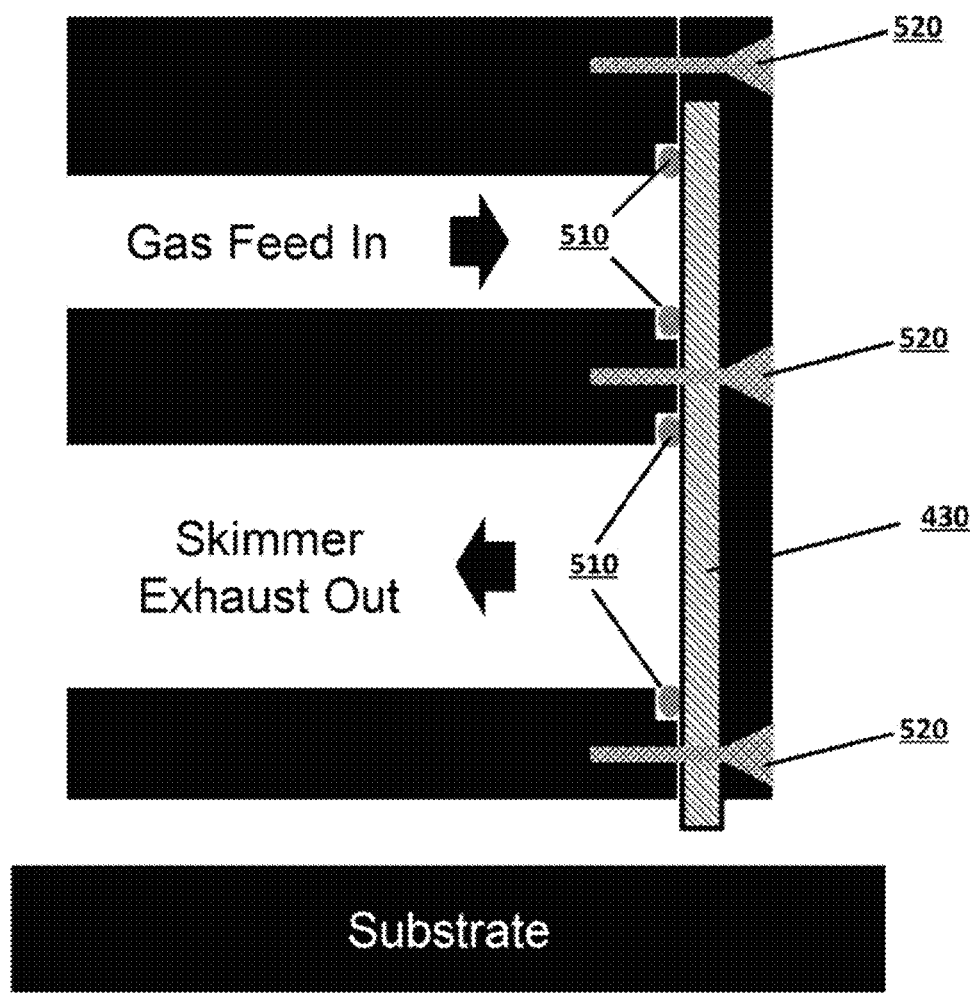
FIG. 5 shows a side view an example print head clamped into a heated gas service manifold according to an embodiment of the invention.

FIG. 4 shows a side view of an example print head die according to an embodiment of the invention. As previously described, one or more print heads may be monolithically integrated into a single die. A die as shown in FIG. 4 may include, for example, silicon and borosilicate glass layers joined by an anodic bond. The bond may provide a seal at the interface between the two layers, creating cavities 410, 420 for gas flow. The print head may be patterned during fabrication with, for example, a deep reactive ion etch (DRIE) on both sides. Other suitable fabrication schemes include microscale electron discharge machining, focused ion beam milling, laser ablation, electroforming, imprint lithography, molding, casting and diamond milling. A nozzle as shown in FIG. 3 may be provided by the un-etched structure separating the etched inlet cavity from the etched exhaust cavity. Similarly, a skimmer as illustrated in FIG. 3 may be provided by an un-etched region that defines the region between the etched exhaust cavity 420 and the outside of the print head. Cavities may be formed, for example, by etching the Si face bonded to the glass. Vias may be formed by etching the reverse side of the Si layer, so that vapor can be added and removed from the cavities such as by using an apparatus as shown in FIG. 5, which shows the print head clamped into a heated gas service manifold. The print head 430 may be, for example, a microfabricated die made from bonded glass and silicon, which may be mated to the manifold with O-ring seals 510. Pressure may be applied to the die and O-rings by a clamping plate held in place by screws 520 or similar connectors. The manifold may be ported with one or more tubes to deliver a carrier gas and/or organic vapor mixture to the top portion of the die. It also may include a cavity to capture exhaust gas from the mid-portion of the die without introducing it into the chamber. Molecular beams generated by the die leave through the lower portion, shown protruding from the bottom of the manifold. The beams impinge on the substrate and organic molecules adsorb to the substrate surface. Printed patterns can be generated by moving the die and substrate relative to each other.

Flow above the nozzle in embodiments disclosed herein operates in a continuum regime. Intensive properties of the fluid flow are well defined throughout the flow field upstream of the nozzle. Organic vapor and carrier gas are in thermodynamic equilibrium. Flow accelerates to sonic velocity through the nozzle stricture and then it accelerates further as it expands through the outlet. Molecules of organic vapor are pushed forward by collisions with carrier gas, so they take on the bulk velocity of the flow.

Typically, to achieve a collimated jet of material, it is preferred for the bulk velocity of the flow to be greater than the thermal velocity of the organic molecules. The organic molecules therefore may be accelerated to hyperthermal velocity parallel to the nozzle axis. As the jet continues to expand, it enters the transition regime where Kn~1, and collisions between organic molecules and carrier gas become less frequent. Carrier gas particles move with molecular velocity orthogonal to the nozzle centerline at $c\perp_{RMS}$=sqrt$(k_b T/m_1)$=1100 m/s at 600K. The bulk velocity of the jet, U, parallel to the nozzle centerline is of the same order. Conversely, organic $c\perp_{RMS}$=sqrt$(k_b T/m_2)$=100 m/s, however, the jet accelerates organic molecules to a significant fraction of U along the nozzle centerline.

Figure 6:
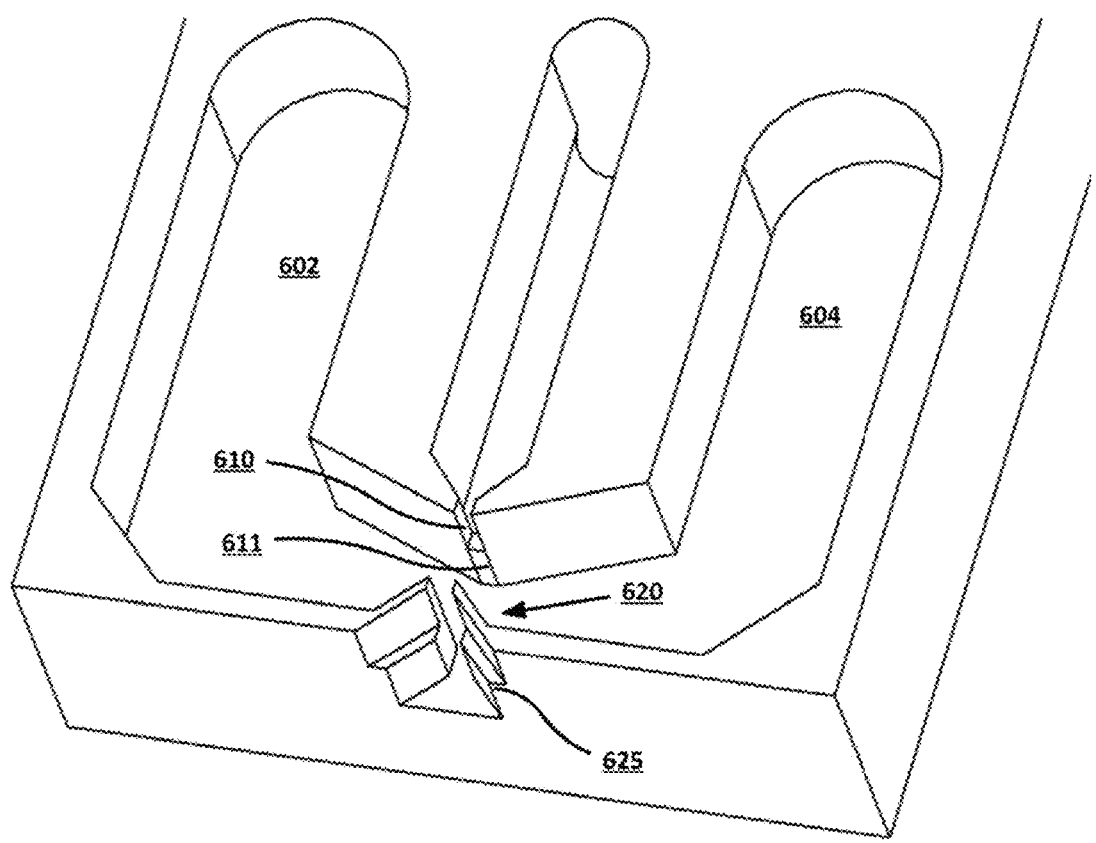
FIG. 6 shows an example micronozzle, skimmer, and adjoining cavities according to an embodiment of the invention.
Figure 7:
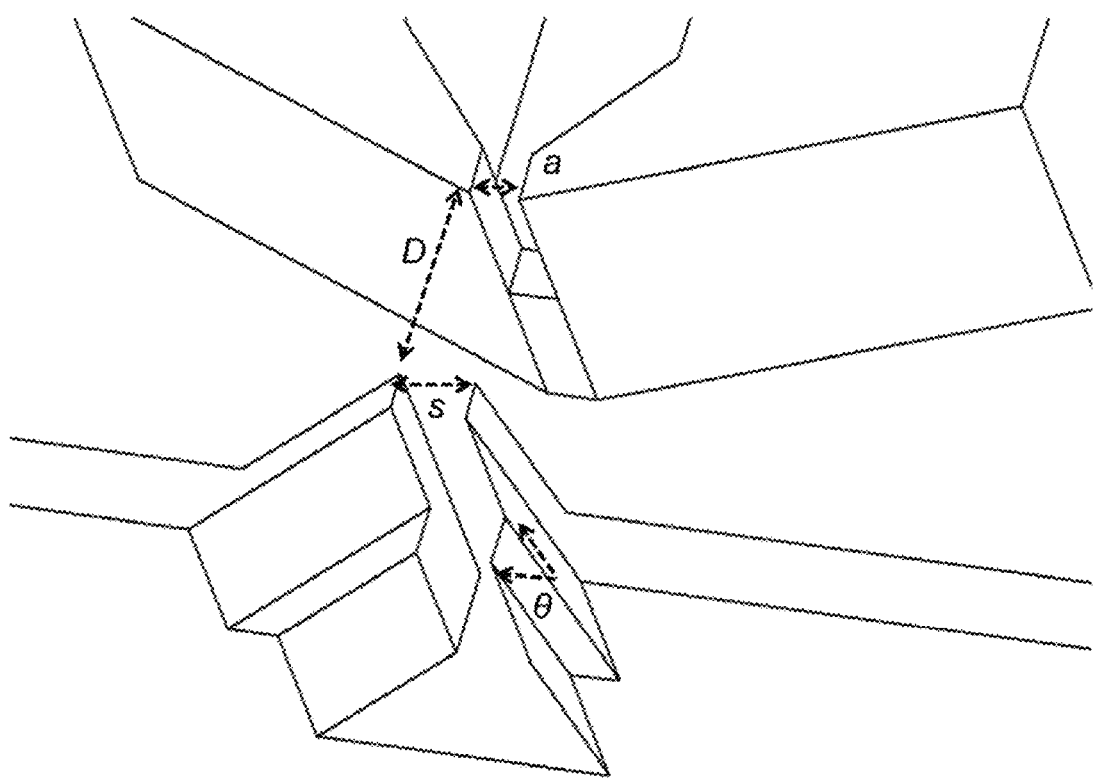
FIG. 7 shows an enlarged view of a micronozzle and skimmer as shown in FIG. 6.

In some cases, it may be beneficial to use a "stepped" skimmer. FIG. 6 shows a perspective view of an example nozzle 610, skimmer 620, and adjoining exhaust cavity or cavities 602, 604, which may be etched into a die prior to bonding according to an embodiment of the invention. The skimmer 620 may include one or more "steps" 625, such that the skimmer walls have a non-uniform thickness as shown. FIG. 7 shows a close-up of the nozzle and skimmer structure, including various dimensions described herein. A structure as shown in FIGS. 6 and 7 may be fabricated using a two-step etching process, which produces two regions etched to different depths. For example, a deeper etch may be used to define the exhaust cavity and other structures. A shallower etch may be used to define the base of the nozzle orifice and a step-like structure backing the skimmer.

A multi-layer structure as shown in FIGS. 6 and 7 may provide one or more benefits, and thus may be preferred in some embodiments. For example, a stepped skimmer structure may reduce wear on masking structures used during fabrication by replacing a single, relatively deep etch with multiple, shallower etches. As another example, the drag between the gas jet issuing from the nozzle and the exhaust cavity floor may be reduced due to the additional separation 611 provided between the nozzle orifice and the cavity floor. In addition, the overall mechanical strength of the skimmer may be improved.

Figure 8:
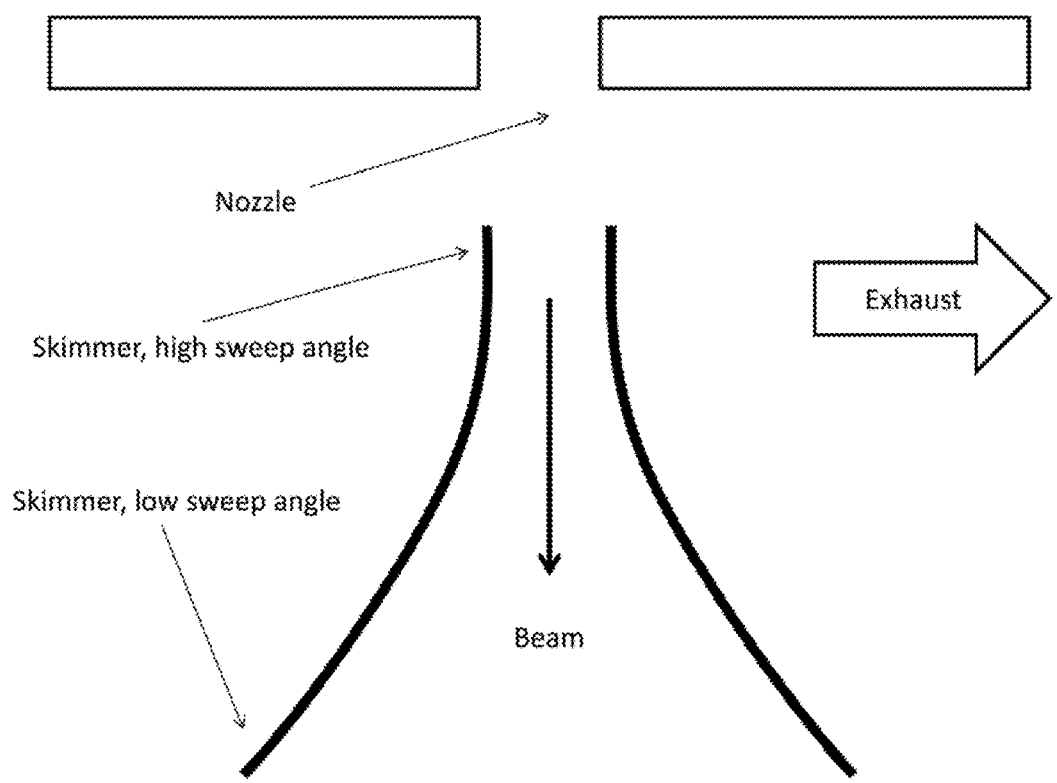
FIG. 8 shows an example skimmer arrangement according to an embodiment of the invention.

FIG. 8 shows a schematic view of another skimmer arrangement according to an embodiment of the invention. In such a configuration, the skimmer may have a non-uniform sweep angle. That is, the sweep angle may vary depending upon where it is measured. For example, the skimmer may have a continuous, curved shape, such that the sweep angle changes from a lower angle near the skimmer output, to a higher angle near the skimmer orifice, i.e., closer to the nozzle, without any disjoint or "stepped" changes in skimmer angle. In other configurations, a skimmer having a non-uniform sweep angle may have distinct segments, each of which has a constant or uniform sweep angle, such that different portions of the skimmer have different sweep angles. Various different sweep angles and combinations of sweep angles may be used. For example, it may be preferred for the sweep angle to be at least 70° near the nozzle, and/or for the sweep angle to be not more than 50° near the skimmer output. Various angles may be used for different portions of the skimmer, both in configurations having either a continuous sweep angle, and in configurations having a segmented configuration that has discrete sweep angles at various parts of the skimmer]A sharp (near 90°) skimmer sweep angle may be less disruptive to the incoming gas jet form the nozzle but, because the resulting skimmer outlet is relatively narrow, there is more interaction between the walls of the skimmer and the molecular beam near the substrate, which can degrade the printing resolution. In contrast, a widely flared (near 0°) skimmer decreases these interactions but also produces more disruption to the incoming gas jet near the nozzle. Therefore, there may be advantages to designing a skimmer with curved walls, trending from high angle near the nozzle to low angle near the substrate to simultaneously minimize beam disruption and interaction with the skimmer walls.

The acceleration of organic material along the nozzle centerline may provide several beneficial effects. First, it may provide collimation to the beam. Since organic vapor can be moving up to ten times more rapidly towards the substrate than orthogonal to the substrate, the divergence of the beam may be as small as 6°. Second, because organic material tends to stay within or relatively near the center of the beam, selecting out the beam center may preferentially enrich the organic content of the beam relative to the carrier gas content.

A skimmer as disclosed herein may block the motion of the majority of the carrier gas towards the substrate, while reducing or minimizing perturbation to the streamlines of carrier gas flow towards the center of the jet. The jet expands further downstream of the skimmer to become a free molecular flow. At this point the carrier gas does not have sufficient density to interact with the organic vapor strongly. The organic molecules follow ballistic trajectories towards the substrate with the momentum imparted to them by the jet in the continuum and transition regions, and overspray therefore may be reduced or minimized. The skimmer also may block some organic molecules from reaching the substrate, for example when molecules become entrained in the exhaust stream rejected from the deposition zone. Therefore, there may be a tradeoff between printing resolution and material utilization efficiency, as described in further detail below.

EXPERIMENTAL

To illustrate the operation and advantages of the embodiments of the invention, thickness profiles of printed lines have been modeled using a two-dimensional Direct Simulation Monte Carlo algorithm (Bird 1994). It is assumed for the simulations that a dilute organic vapor of mass 500 g/mol and collision diameter 1 nm is entrained in a He carrier gas at a reservoir temperature of 600K. The print head structures are also at a temperature of 600K and the substrate is at 300K. The skimmer exhaust pressure is maintained at 100 Pa. In the figures, printed features are presumed to be lines with axes normal to the plane of the page. Calculated thicknesses are normalized and plotted as a function of distance from the nozzle centerline, transverse to the direction of printing.

FIG. 9 shows a thickness profile for a feature printed by a nozzle and skimmer with θ=45°, a=10 μm, s=20 μm, g=100 μm and D=200 μm (solid line), where the dimensions refer to the same dimensions described with respect to FIG. 3. The thickness profile is compared with a thickness profile of an un-skimmed nozzle beam, with θ=0°, a=10 μm, g=100 μm and D=0 Ξm (dotted line). The inlet pressure is 32,000 Pa. The simulated deposition thicknesses are multiplied by 10 in the shaded right-most region of the profiles to highlight small absolute differences in the amount of material deposited far from the nozzle centerline in the skimmed and un-skimmed cases. It was found that the presence of a skimmer reduces the full width at half maximum for the printed feature by approximately 20 μm. It also reduces the long range overspray surrounding the printed feature. For example, the particular dimensions in this embodiment enable the skimmer to reduce the amount of material deposited at a distance of 80 μm from the nozzle centerline by an order of magnitude.

Figure 10:
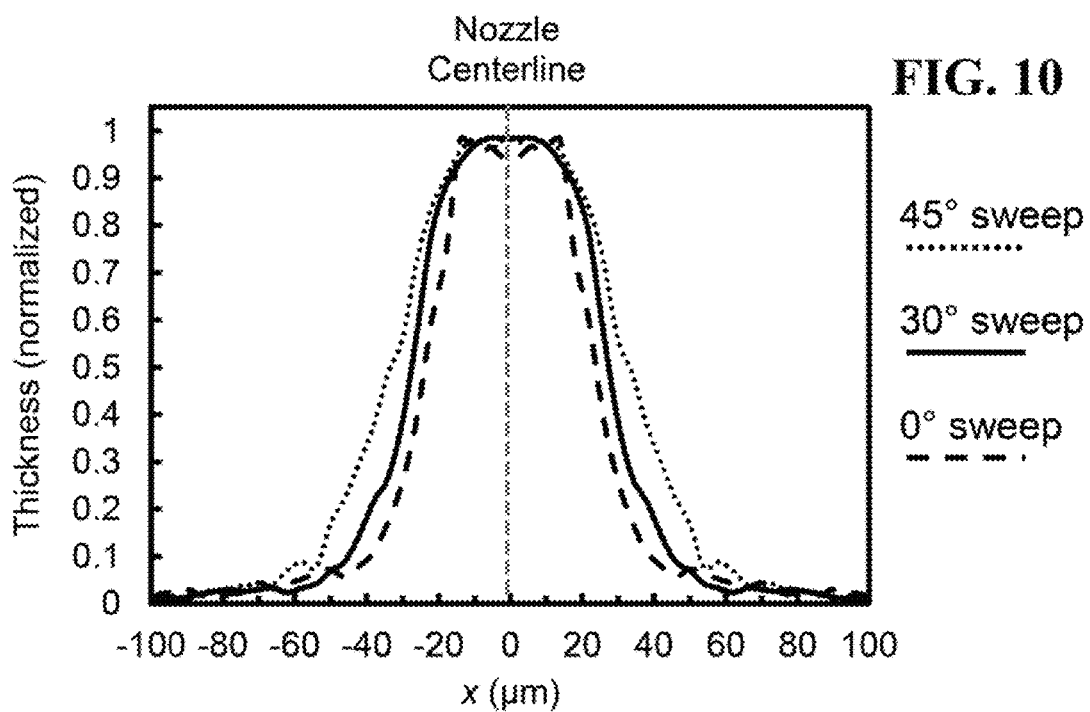
FIG. 10 shows an example of thickness profiles of features printed by coupled nozzle/skimmer pairs of varying sweep according to embodiments of the invention.

FIG. 10 shows show how the angle ("sweep") of the skimmer relative to the plane of the nozzle may affect the profile of the deposited line. In all cases shown a=10 μm, s=20 μm, g=100 μm and D=200 μm, and the inlet pressure is 32,000 Pa. Features appear most sharply defined, with the smallest full width at half maximum, flattest peak, and most sloped sidewalls, for the θ=0° case (dashes). The θ=45° case (solid) produces a wider, more rounded profile, and the θ=30° case (dots) is intermediate between the two. Despite the apparent trend towards better resolution from shallow angle skimmers, it has been found that sharply swept skimmers may generate less far-field overspray than shallower skimmers, as quantified below. Far-field overspray refers to the fraction of organic material passing through the nozzle that neither lands in the simulated deposition zone nor is removed by the skimmer exhaust. The choice of skimmer sweep angle may therefore depend on the specific application for which the device is to be used. As used herein, the utilization efficiency refers to the fraction of organic material passing through the nozzle that lands within a simulated deposition zone extending 150 μm from the nozzle centerline. Utilization ratio is less sensitive to skimmer sweep angle than to the separation between the nozzle orifice and skimmer orifice.

TABLE 1

Effect of skimmer sweep angle on overspray and material utilization.

| θ | Utilization (%) | Overspray (%) |
|---|---|---|
| no skimmer | 97.7 | 2.3 |
| 0° | 25.3 | 0.37 |
| 30° | 21.8 | 0.41 |
| 45° | 21.9 | 0.18 |
| 66° | 17.2 | 0.09 |

Figure 11:
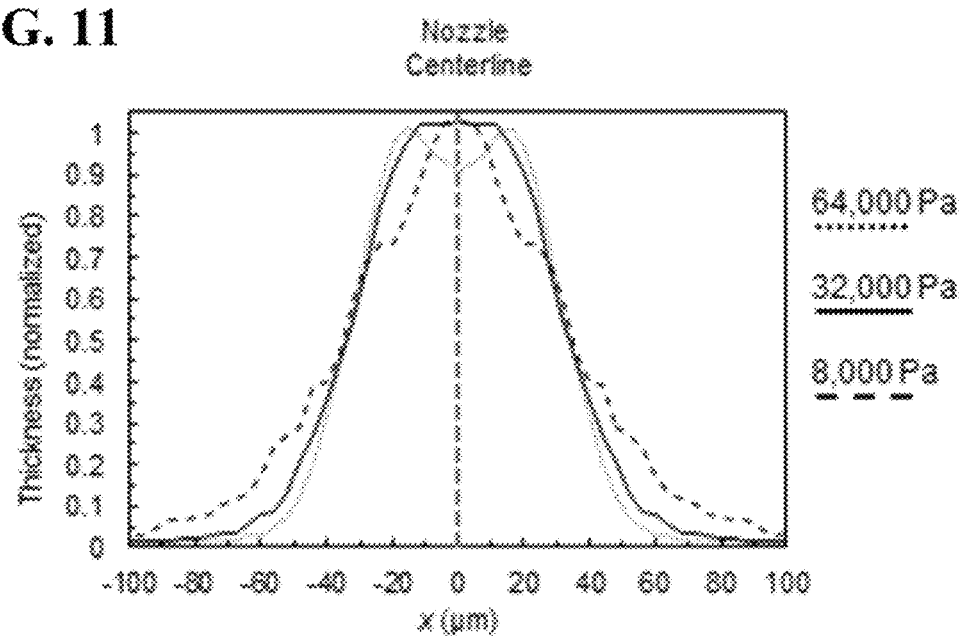
FIG. 11 shows thickness profiles of features printed by coupled nozzle/skimmer pairs at varying inlet pressures according to embodiments of the invention.

FIG. 11 shows thickness profiles of features printed by coupled nozzle/skimmer pairs at varying inlet pressures. In all cases θ=45°, a=10 μm, s=20 μm, g=100 μm and D=200 μm. The inlet pressure is varied from 8,000 Pa (dashed line), to 32,000 Pa (solid line) and 64,000 Pa (dotted line). It was found that printed features become more sharply defined with increasing pressure, illustrating the importance of maintaining a significant pressure drop between the nozzle and skimmer. In operation, this may translate into a minimum flow rate for effective operation.

Figure 12:
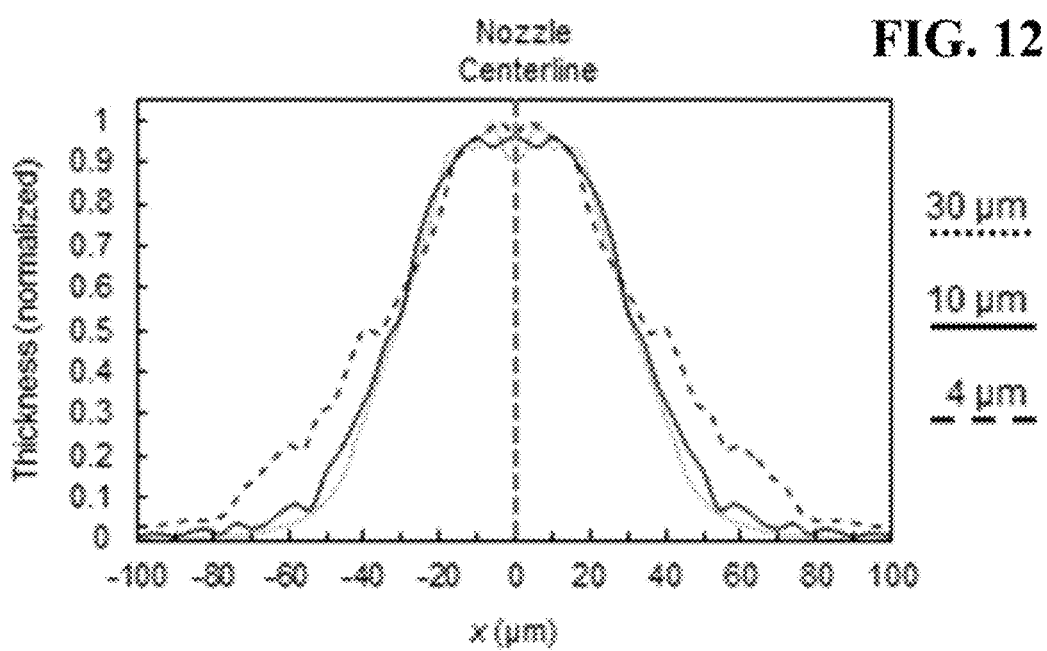
FIG. 12 shows thickness profiles of features printed by coupled nozzle/skimmer pairs with varying nozzle widths a according to embodiments of the invention.

FIG. 12 shows thickness profiles of features printed by coupled nozzle/skimmer pairs as disclosed herein, at various nozzle widths a. In all cases θ=45°, s=20 μm, g=100 μm and D=200 μm. The inlet pressure was kept constant at 32,000 Pa. It was found that a narrow a=4 μm width nozzle (dashes) produces a wide, rounded profile with a large surrounding overspray tail. Larger a=10 μm (solid) and a=30 μm (dots) nozzles produce more sharply defined features.

Figure 13:
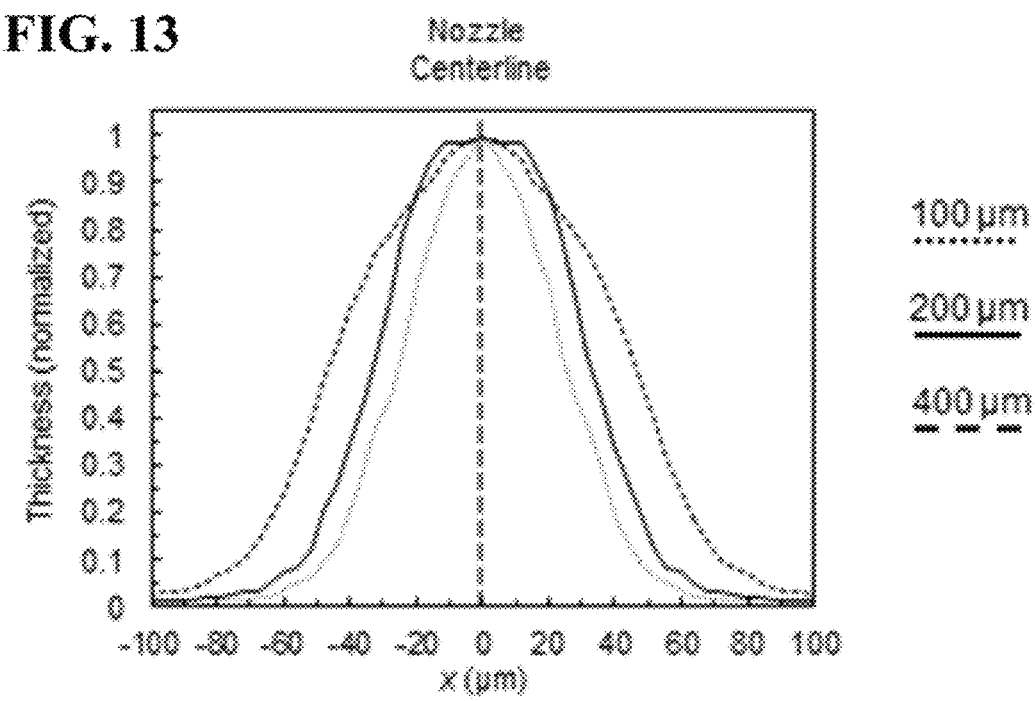
FIG. 13 shows thickness profiles of features printed by coupled nozzle/skimmer pairs with varying nozzle aperture-to-skimmer orifice separation widths D according to an embodiment of the invention.

FIG. 13 shows thickness profiles of features printed by coupled nozzle/skimmer pairs as disclosed herein, at various nozzle aperture-to-skimmer orifice separation widths l. In all cases θ=45°, a=10 Ξ, s=20 μm, and g=100 μm. The inlet pressure was kept constant at 32,000 Pa. The separation was varied from D=100 μm (dots), to D=200 μm (solid) and D=400 μm (dashes). It was found that greater values of D result in narrower profiles with more sharply defined sides and less overspray. However, configurations that provide more desirable levels of overspray also may result in a decrease in material utilization efficiency as shown in Table 2, below. Generally, it was found that increasing D reduces the utilization efficiency of the material, but results in a reduction of far field overspray.

TABLE 2 far-field overspray produced by nozzles with various nozzle aperture to substrate orifice separations D.

| D | Utilization (%) | Overspray (%) |
|---|---|---|
| 100 | 39.7 | 0.44 |
| 200 | 21.9 | 0.18 |
| 400 | 11.1 | 0.11 |

Figure 14:
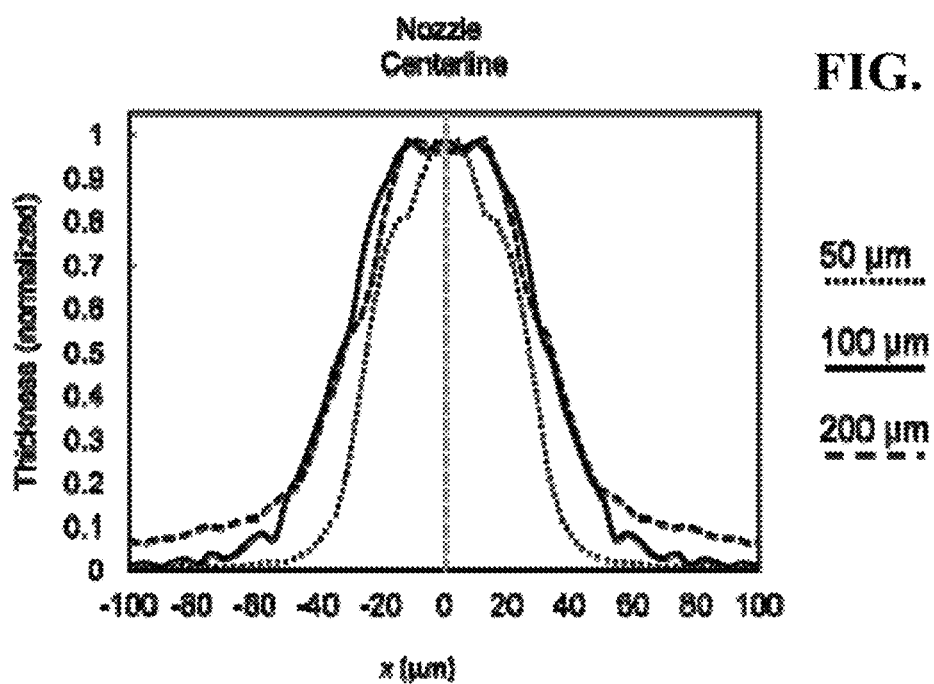
FIG. 14 shows thickness profiles of features printed by coupled nozzle/skimmer pairs with varying print head to substrate separations g according to embodiments of the invention.

FIG. 14 shows thickness profiles of features printed by coupled nozzle and skimmer pairs as disclosed herein, at various print head-to-substrate separations g. In all cases θ=45°, a=10 μm, s=20 μm, and D=200 μm. The inlet pressure was kept constant at 32,000 Pa. The separation was varied between g=50 μm (dashes), g=100 μm (solid) and g=200 μm (dots). It was found that in general smaller values of g produce sharper deposition profiles. However, acceptable profiles with the skimmer architecture are obtained at up to 100 μm separation, whereas separation on the order of the nozzle width typically would be required for a bare nozzle.

From these data, it is possible to specify dimensions for a skimmer and nozzle for use with an OVJP process based upon the required resolution, feature spacing, and achievable working distance for the nozzle. The relevant parameters are:

a In general, larger nozzles produce less sharply-peaked jet plumes. This may allow the skimmer to collect a more collimated beam and print more confined, straight-walled features. On the other hand, flow rate through the nozzle scales as $a^3$, so it may rapidly become difficult or impossible to exhaust sufficient carrier gas to maintain low pressure in the exhaust cavity. As indicated in FIG. 12, a=10 μm appears to be an appropriate value for printing at the resolution required for a large display, such as for a television or monitor.

θ The preferred sweep angle for the skimmer itself typically is a compromise between minimizing the perturbation of flow streamlines upstream of the skimmer and minimizing the scattering of the beam downstream of the skimmer due to interaction with the skimmer walls. The former requirement favors a large sweep, while the latter favors a small sweep. A sweep of 60° may be considered optimal in some configurations. (Bird, 1976) Using a skimmer in a print head imposes an additional constraint. The degree to which the molecular beam diverges before it hits the substrate is determined by the distance between the skimmer orifice s and the substrate. This is further removed from the substrate for a highly swept skimmer, since the membrane at the base of the skimmer cannot touch the substrate. For sweeps greater than 45°, the beam collimation from the skimmer was negated by the greater aperture to substrate distance. The presence of a skimmer produced increasingly collimated deposition profiles for sweeps from 45° to 0°, as seen in FIG. 10. The greater perturbation of the carrier gas flow field somewhat increased long range overspray for shallow sweep angles. Skimmer height may need to be optimized along with sweep angle to produce an optimal or preferred single skimmer system. Furthermore, use of a series of compound skimmers with different sweep angles may further reduce this tradeoff Ultimately, a curved skimmer profile may be desirable, wherein θ is effectively large near the nozzle and decreasingly small near the substrate, however such a design may be more complex and expensive to fabricate.

Figure 9:
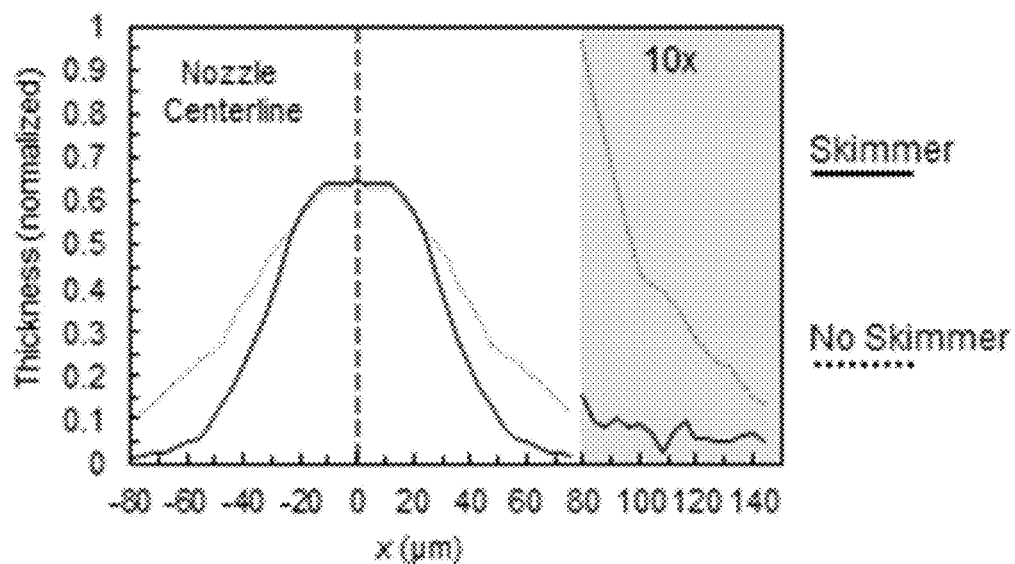
FIG. 9 shows a thickness profile (solid line) for a feature printed by a nozzle and skimmer as compared to a similar sized nozzle alone.

Inlet Pressure Carrier gas leaves the nozzle orifice in choked flow condition, meaning that the speed of the jet is approximately sonic in all cases. Therefore the difference in beam of organic vapor that gets directed to the substrate will be primarily due to the density, rather than the velocity of the carrier gas jet. At a low inlet pressure of 8,000 Pa, the carrier gas jet is relatively diffuse and does not impart much momentum to the organic vapor. The result is a less directional beam of organic vapor and poorly defined printed features. At higher inlet pressures of 32,000 and 64,000 Pa, a denser jet imparts more momentum to the organic vapor, producing a more strongly directional beam. In general there appears to be a diminishing benefit to operating at inlet pressures of 64,000 Pa and greater. The benefits of a more directional beam also should be weighed against the mechanical stresses on the skimmer, the volume of exhaust gas to be removed, and the difficulty of producing organic vapor feeds at atmospheric pressure in a particular application.

g Smaller print head-to-substrate separations are more conducive to printing high resolution features. As illustrated by FIG. 9, without a skimmer, the size of a printed feature is on the order of g and is surrounded by a considerably wider overspray tail. Conventional industrial applications typically require g tolerances which are considerably looser than the desired feature size. As shown in FIG. 14, a skimmer provides a means to print features smaller than g and reduce the sensitivity of printed features to the magnitude of g. While the skimmer reduces the dependence of feature width on g, the dependence still exists, and features tend to get wider and more diffuse at larger g. As shown by FIG. 14, smaller separations typically produce more well-defined features.

D A longer separation between the nozzle and the skimmer allows the carrier gas to impart more downward velocity to the organic vapor. Since multiple molecular collisions are required to get the much larger organic molecules to bulk jet velocity, a large acceleration zone is beneficial. Since beam divergence is determined by the thermal velocity of organic molecules orthogonal to their direction of bulk flow, a faster beam is less divergent. Furthermore, moving the skimmer away from the nozzle allows the skimmer to isolate a more collimated portion from a gas jet that is wider overall. Flow streamlines are also less perturbed by the skimmer, since exhaust gasses can be removed efficiently by the larger exhaust cavity. However, as previously shown, the improvement also may be linked to a decrease in material utilization efficiency. Since a skimmer placed further away skims a smaller overall portion of the jet from the nozzle to form a beam, more organic vapor is sunk in the exhaust. For a=10 μm nozzle and s=30 μm, D=200 μm is a reasonable value to balance resolution and materials use.

A final relevant parameter is the pressure at the skimmer exhaust. The presence of a significant skimmer exhaust pressure tends to degrade performance by causing the skimmer to act as a nozzle, with the exhaust pressure driving the expansion of a jet through the orifice, which is undesirable. Due to the relatively long mean free paths and high diffusivity of organic vapor in the carrier gas, the exhaust pressure does little to confine the expansion of the jet produced by the nozzle. Simulations as described herein suggest that a lower skimmer outlet pressure is better. Consequently, the simulations were done at an exhaust pressure of 100 Pa, a value that may be practically achieved by actively pumping the skimmer exhaust.

The requirements on upstream and downstream pressure may be used to determine the required flow rates for the particular nozzle dimensions that are useful for high resolution, large panel OLED manufacture, such as for use in large-panel displays and similar devices. The flow between two parallel plates is given by Equation 1 as a function of upstream and downstream pressures $P_1$ and $P_2$. This approximates the case of a rectangular slit nozzle that has an aperture of a=10 μm wide by d=400 μm deep cut through a 30 μm thick Si membrane.

$$Q = \frac{a^3 d}{24 \mu t RT}(P_1^2 - P_2^2) \quad (1)$$

Assuming the above conditions and a feed of 600K He, a flow of 1.25 sccm per nozzle is required. Due to the cubic dependence on a, this reduces significantly for a narrower a=4 μm nozzle. Only 0.08 SCCM is required per nozzle in that case. Conversely, going to a larger nozzle such as a=30 μm, over 40 sccm of flow is required to maintain a 32,000 Pa pressure difference.

Exhausting flow from the skimmer is one of the most critical aspects of print head design. The rate at which excess carrier gas can be removed from around the skimmer defines the limits on nozzle aperture size and inlet pressure. Carrier gas exhaust must flow through two regimes to be removed from the print head. First it must pass through the exit vias as a free molecular flow. Gas mass flow Q through the vias is given by Equation 2. The gas flow must then pass through a macroscopic plenum leading to a high vacuum exhaust.

$$Q = \frac{8r^3}{3t} \frac{\Delta P}{\sqrt{2\pi m RT}} \quad (2)$$

Assuming two vias of radius r=200 μm vias can etched into t=100 μm thick Si, a pressure difference of approximately 50 Pa is required to drive 1.25 sccm through the vias. Note that round vias are used as an approximation for square vias in FIG. 3.

The plenum accepting flow from the nozzle and print head die can be treated as in the continuum regime due to its longer characteristic dimension. In that case, its conductivity to flow is given by Equation 3:

$$Q = \frac{\pi}{16 \mu l RT} r^4 \Delta P^2 \quad (3)$$

Assuming an exhaust plenum of r=1 cm radius and D=40 cm length, a 12 Pa pressure difference would be required to transport the 12.5 sccm of exhaust gases generated by an array of ten 10 μm nozzles. The expected skimmer exhaust pressure is 65 Pa. The minimum skimmer exhaust pressure achievable in a real system may, however, be higher due to, for example, molecular effects in the plenum as well as losses in the structure coupling the die to the plenum.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A device comprising:
   at least one inlet via;
   a plurality of nozzles, each nozzle in fluid communication with at least one inlet via and each nozzle having an aperture width a;
   a first plurality of skimmers, each skimmer of the first plurality of skimmers aligned with an associated nozzle of the plurality of nozzles and having an orifice width s and an output width w, the orifice disposed a distance D from an outer edge of the associated nozzle; and
   a plurality of exhaust cavities, each exhaust cavity is in fluid communication with at least one of the plurality of nozzles, wherein each exhaust cavity is disposed between one of the plurality of nozzles and one of the plurality of skimmers and wherein the plurality of nozzles and the plurality of skimmers are monolithically integrated within a single nozzle die.

2. The device of claim 1, wherein the first nozzle die comprises two portions diffusion-welded together to form the first nozzle die.

3. The device of claim 1, wherein the first die is replaceable portion of the device.

4. The device of claim 1, further comprising a housing configured to receive the first nozzle die.

5. The device of claim 4, wherein the first single nozzle die is a replaceable portion of the device, and the housing is configured to receive any of a plurality of nozzle dies.

6. The device of claim 4, said housing further comprising a substrate holder, wherein the substrate holder is disposed below the plurality of skimmers when the first single nozzle die is disposed within the housing.

7. The device of claim 4, said housing further configured to receive an organic material source.

8. The device of claim 1, further comprising a second plurality of skimmers, each skimmer of the second plurality of skimmers disposed below one of the first plurality of skimmers and aligned with the one of the first plurality of skimmers and aligned with the nozzle associated with the one of the first plurality of skimmers.

9. The device of claim 1, further comprising at least one exhaust via in fluid communication with at least one of the plurality of exhaust cavities.

10. The device of claim 9, further comprising a vacuum source in fluid communication with the at least one exhaust via.

11. The device of claim 1, wherein a is in the range of 5-50 µm.

12. The device of claim 1, wherein D is in the range of 100-800 µm.

13. The device of claim 1, wherein s is in the range of 5-100 µm.

14. The device of claim 1, wherein the skimmer has a sweep angle θ in the range of 0-60°.

15. The device of claim 14, wherein the skimmer has a sweep angle θ in the range of 30-50°.

16. The device of claim 1, wherein the skimmer has a non-uniform sweep angle.

17. The device of claim 16, wherein the skimmer has a sweep angle that varies continuously from a first angle at a portion near the output of the skimmer, to a second angle at a portion near the nozzle.

18. The device of claim 17, wherein the first angle is in the range 0-50° and the second angle is in the range 70-90°.

19. The device of claim 16, wherein the skimmer comprises a plurality of segments, each segment having a different sweep angle.

20. The device of claim 19, wherein a first segment has a sweep angle in the range 0-50° and a second segment has a sweep angle in the range 70-90°.

21. The device of claim 1, further comprising a substrate support disposed at a distance $d_g$ below the output of the skimmer.

22. The device of claim 21, wherein $d_g$ is in the range 10-1500 µm.

23. The device of claim 1, wherein the device comprises a semiconductor.

24. The device of claim 1, wherein the device comprises a metal.

25. The device of claim 1, wherein each of the plurality of nozzles and each of the first plurality of skimmers is fabricated separately, and subsequently integrated into the device in a desired output pattern.

26. The device of claim 1, further comprising an inlet carrier gas source in fluid communication with the inlet via.

27. The device of claim 26, wherein the inlet carrier gas source is configured to provide an inlet pressure in the range 8-64 kPa.

28. The device of claim 1, wherein the nozzle aperture is rectangular.

29. The device of claim 28, wherein the skimmer orifice is rectangular.

30. The device of claim 1, wherein the skimmer orifice is rectangular.

31. The device of claim 1, further comprising a rastering mechanism configured to move the device in a direction approximately parallel to a substrate holder placed below the plurality of skimmers.

32. The device of claim 31, wherein the rastering mechanism is configured to move the device at a constant height from a substrate placed on the holder.

33. The device of claim 31, wherein the rastering mechanism is configured to move the first die in a direction parallel to the longest direction of the nozzle aperture.

34. The device of claim 1, wherein at least one skimmer of the plurality of skimmers is a stepped skimmer.

* * * * *